United States Patent

Johnsen et al.

[11] Patent Number: 5,880,938
[45] Date of Patent: Mar. 9, 1999

[54] CIRCUIT BOARD WITH SCREENING ARRANGEMENT AGAINST ELECTROMAGNETIC INTERFERENCE

[75] Inventors: Helge Bodahl Johnsen, Huddinge; Mats Olov Timgren, Saltsjö-Boo, both of Sweden

[73] Assignee: Telefonaktiebolaget LM Ericsson, Stockholm, Sweden

[21] Appl. No.: 894,629

[22] PCT Filed: Mar. 25, 1996

[86] PCT No.: PCT/SE96/00370

§ 371 Date: Aug. 22, 1997

§ 102(e) Date: Aug. 22, 1997

[87] PCT Pub. No.: WO96/31107

PCT Pub. Date: Oct. 3, 1996

[30] Foreign Application Priority Data

Mar. 31, 1995 [SE] Sweden .................................. 95011714

[51] Int. Cl.[6] ........................................................ H05K 9/00
[52] U.S. Cl. ........................... 361/818; 361/748; 361/800; 174/35 R
[58] Field of Search ..................................... 361/748, 760, 361/800, 816, 818, 777; 174/35 R, 250; 333/204

[56] References Cited

U.S. PATENT DOCUMENTS

| | | |
|---|---|---|
| 4,758,896 | 7/1988 | Ito . |
| 4,801,489 | 1/1989 | Nakagawa et al. . |
| 5,006,667 | 4/1991 | Lonka . |
| 5,043,526 | 8/1991 | Nakagawa et al. . |
| 5,140,110 | 8/1992 | Nakagawa et al. . |
| 5,274,193 | 12/1993 | Bailey et al. . |
| 5,323,299 | 6/1994 | Weber . |
| 5,335,147 | 8/1994 | Weber . |
| 5,341,274 | 8/1994 | Nakatani et al. . |
| 5,428,506 | 6/1995 | Brown et al. . |
| 5,430,933 | 7/1995 | Marx et al. ................................ 29/846 |

FOREIGN PATENT DOCUMENTS

| | | |
|---|---|---|
| 0 238 267A2 | 3/1987 | European Pat. Off. . |
| 0 470 031A2 | 6/1991 | European Pat. Off. . |
| 0578888 A1 | 1/1994 | European Pat. Off. . |
| 91/01618 | 2/1991 | WIPO . |

*Primary Examiner*—Leo P. Picard
*Assistant Examiner*—Jayprakash N. Gandhi
*Attorney, Agent, or Firm*—Burns, Doane, Swecker & Mathis, L.L.P.

[57] ABSTRACT

A circuit board (1) which comprises a plurality of electrically conductive layers, conductive patterns formed in the layers, and intermediate electrically insulating layers, and which further comprises a surface-related layer (3) which screens against electromagnetic interference, wherein an outermost conductive layer (3) is provided with a plurality of coordinated connection islands (3a–3e) or the like, where selected connection islands are adapted for electrical and mechanical coaction with connection pads (2a–2d) or the like for a surface-mounted discrete component (2). A further electrically conductive layer (4) disposed contiguous with and beneath the outermost conductive layer (3) and separated by an insulating layer is comprised of a layer foil that screens against electromagnetic interference. The electrically conductive layer foil has formed therein a plurality of through-penetrating holes (4a, 4e), each of which is adapted and dimensioned with a cross-sectional size which slightly exceeds the cross-sectional size of an electric conductor (2a) drawn through a respective hole (4a), the electric conductor (2a) being connected at one end, either directly or indirectly, to one of the connection pads (2a–2d) and at its other end directly to a conductor (6a) in a conductor pattern formed in an inner, further electrically conductive layer (6).

13 Claims, 2 Drawing Sheets

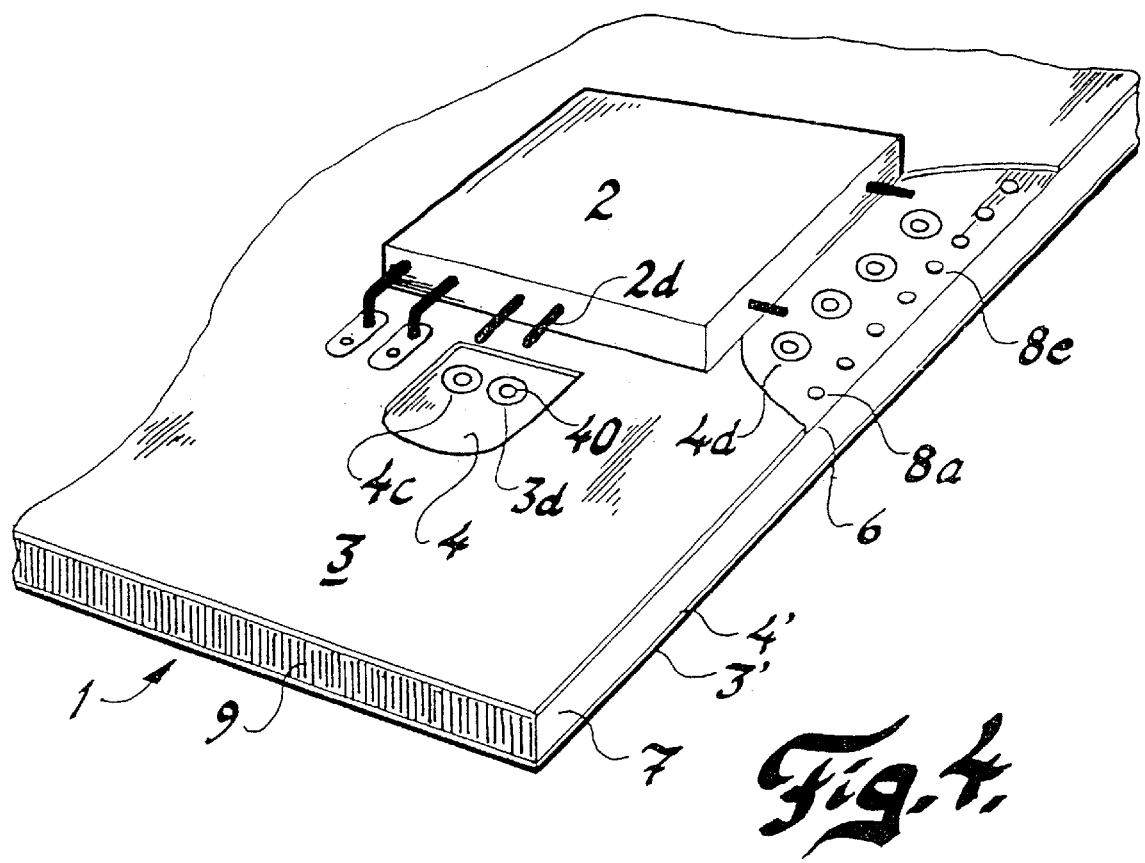

CIRCUIT BOARD WITH SCREENING ARRANGEMENT AGAINST ELECTROMAGNETIC INTERFERENCE

TECHNICAL FIELD

The present invention relates to a circuit board and more particularly, but not exclusively, to circuit boards of the kind that are comprised of a plurality of superposed electrically conductive layers such as to form conductive patterns, and electrically insulating layers there between.

More particularly, the present invention is concerned with the construction of a circuit board that includes surface-related electrically conductive layers which screen against electromagnetic interference, wherein one such outermost conductive layer is provided with a plurality of coordinated connection islands where selected islands are adapted for electrical and mechanical coaction with connection conductors, connection pads, connection pins or the like or a discrete surface-mounted component.

DESCRIPTION OF THE BACKGROUND ART

Several different designs of such circuit boards are known to the art.

The latest development within electronic equipment tends towards increasing signal speed and towards increasing the compactness of discrete circuits on circuit boards. These measures has led to problems relating to electromagnetic interference (EMI).

Various measures have also been proposed in endeavours to reduce or fully eliminate the electromagnetic interferences that result primarily from higher signal rates and short switch-over times.

Concerns other than EMI are related to electromagnetic compatibility (EMC) and electromagnetic discharge (EMD).

It is also known to fully "cover" or enclose circuits of this kind in an electrically conductive material so as to obtain effective screening to and from the surroundings.

It is also known to fully encapsulate circuit boards in a metallic casing and to provide delimited holes in the casing through which cables and conductors can be connected to the circuit board.

In the case of circuit boards, it is known to attempt to "cover" and enclose the signal-carrying conductors formed in one or more electrically conductive layers in the form of copper foils inwardly of a circuit board having external earth-potential related electrically conductive layers.

An example of this technique is given in publication EP-A2-0 238 267.

Such measures are taken in order to prevent external electromagnetic interference fields from obtaining access to the interior of the circuit board and also to prevent the emission of electromagnetic fields generated by board components as interference fields.

It is also known in circuit boards to endeavour to utilize mutually opposing external electrically conductive layers and to connect said layers to earth potential such as to give said layers a screening function.

However, such circuit boards normally require electric conductors to be included in these screening layers.

The provision of such conductors requires conductor-related foil sections to be isolated from the electrically conductive layer or from the remainder of the foil, wherein it is known to form said conductors by etching away selected sections of the metal foil, such as to enable the conductors to be formed without contact with the remainder of the metal foil.

In this regard, it is known to permit that part or those parts of the metal foil or the outer copper layers that have not been used as conductors for connection purposes and which have not been etched away to remain on the circuit board and to connect this part or these parts to earth, so that the layer will obtain a partial screening function.

It is quite natural that screening layers etched in this manner are unable to provide a complete or a maximum screen, since several different conductor patterns have been formed therein with peripheral exposure of the metal foil.

Even though encapsulation forms part of the earlier standpoint of techniques in preventing electromagnetic interference, this technique will not be described for the sake of simplicity.

The earlier standpoint of techniques also includes the realization that screening problems are heightened with increasing frequencies of electromagnetic fields and interference fields.

It has been discovered in the development of electronics towards still higher working frequencies and shorter switch-over times that a screening technique of the aforesaid kind is no longer satisfactory.

One of the reasons for this is apparently because the conductors formed in the outer metal layer form radiation sources. Foil sections that have been etched away provide screen-free surfaces through which fields and interference fields are able to pass.

In certain cases, these circumstances may result in a screening layer amplifying outwardly directed radiation and become highly receptive to external radiation or interference fields.

The reason for this is believed to be because chosen dimensions of openings provided in the copper layer for forming said conductors within the electrically conductive layer and the chosen lengths of the conductors can result in correspondence to an adapted antenna length or a part thereof for certain frequencies of functions used in the circuit board.

By way of example, it can be mentioned that an oscillation of 3 GHz in air results in a wavelength of 10 cm, and a conductor length of 2.5 cm. generates an antenna function having a ¼ wavelength.

It will be noted that a conductor structure having the aforesaid adapted length is reciprocal, meaning that it functions both in a transmitting and a receiving mode, which in the latter case lowers the immunity that a screen is intended to offer, and certain length dimensions will afford good reception conditions for corresponding external interference frequencies.

With regard to a further standpoint of techniques in this regard, reference can be made to the disclosures made in U.S. Pat. No. 5,341,274.

A bottom layer (4) is comprised of a layer produced from insulating material and can be readily formed with the aid of a stencil-printing process. Subsequent to having formed the bottom layer (4), a conductive layer (5) is formed in a stencil-printing process within a region (12) located beneath an IC circuit. There is then applied a top layer (6) in the form of an insulating material formed around the whole surface of a substrate (1), with the exception of parts (2a) that are intended to receive the pin connectors of an integrated circuit.

The upper layer (6) can be formed from the same material as the bottom layer (4). The publication also discloses that the electrically conductive layer (5) is formed so as to have no contact with the connections (2a) of the integrated circuit in the region between the pin connections, as shown in FIG. 8b.

The frequency components generated within this region will thereby be limited and radiation noise can be dampened.

U.S. Pat. No. 5,274,193 also teaches a multi-layer circuit board which utilizes an electromagnetic screening layer produced from a treated copper paste and applied so as to cover substantially the whole surface.

Publication EP-A1-0 578 888 discloses that a circuit board may be provided with an electrically conductive rail which extends along mutually opposite sides and along a part of its rear side, therewith creating the possibility of connecting the circuit board to an earth plane and therewith create conditions for screening against EMI radiation.

The subject matter of U.S. Pat. Nos. 5,323,299, 5,335,147 and 5,006,667 also forms part of the prior art.

SUMMARY OF THE INVENTION

Technical Problems

When considering the earlier standpoints of technique, as described above, it will be seen that a technical problem resides in enabling, with the use of simple means, a circuit board used at high rate digitalized information-carrying signals and short switch-over times for used signal structures to be effectively screened against electromagnetic interference (EMI) by constructing a further electrically conductive layer from a layer foil which screens against electromagnetic interference and which is located within the circuit board.

It will also be seen that a technical problem resides in realizing the significance of and the advantages associated with simplifying the production of an effectively screened circuit board by locating a further earth-potential related, electrically conductive foil layer close to the surface and fully covering the circuit board without having conductors formed therein and solely presenting a plurality of small through-penetrating holes each having an adapted and dimensioned cross-sectional size which only slightly exceeds the cross-sectional size of an electric conductor, a pin or the like, drawn through the hole.

It will also be seen that a technical problem resides in providing conditions such that each of the electric conductors drawn through said holes in the layer foil can be connected either directly or indirectly at one end with one of the connecting conductors, connecting pads or pin connectors of a discrete component, and at their other end connected directly to a conductor in a conductor pattern formed in an electrically conductive layer where said electrically conductive layer may be earth potential related, with the exception of the conductors.

It will also be seen that a technical problem resides in realizing the significance of limiting the cross-sectional size of a through-penetrating hole in the layer foil to a circular cross-section having a diameter smaller than 1.0 mm.

A particular technical problem is one of not only realizing but also observing that said holes form a resonance circuit having a resonance frequency, and that the size of said holes should be adapted so that the resonance frequency will occur first at above some 100's GHz, and therewith adapted to a level which is far above the highest frequency applicable to the circuit board and its components.

It will also be seen that a technical problem resides in realizing those advantages that are obtained when the conductor drawn through a hole is comprised of a connection sleeve whose one end is able to coact with a connection island or the like.

In respect of two electromagnetic interference screening layers of which one forms said layer foil, a foil which solely includes small conductor-adapted holes, and the other forms a foil in which electrical connection islands are formed, said two foils being mutually isolated electrically by an insulating foil, a further technical problem is one of realizing the significance of enabling said two electromagnetic interference-screening layers to be earth-potential related and pair-wise located on a respective side of a number of signal layers in the form of metal foils.

It will also be seen that a technical problem is one of providing conditions, with the aid of simple means, which enable each of the two electromagnetic interference screening layer foils to be located on its respective side of a number of signal layers with intermediate electrically insulating layers and with pad layers on at least one side.

Another technical problem in the present context is one of realizing the significance of electrically connecting said two layer foils one to the other and with two mutually opposing electrically conductive layers.

It will also be seen that a technical problem resides in the significance of mutually connecting said screening layer foils through the medium of through-plated edge-orientated holes and by spacing the holes at a small distance apart, for instance a spacing of less than 3 mm, preferably about 1 mm, so as also to screen the edge surfaces of the circuit board.

Another technical problem is one of realizing the significance of mutually connecting said screen or shielding layer foils by copper plating.

Solution

With the intention of solving one or more of the aforesaid technical problems, the present invention takes as its starting point a circuit board which is constructed of a plurality of electrically conductive layers, conductor patterns formed in said layers, and intermediate electrically insulating layers, and which further comprises surface-related electrically conductive layers which screens against electromagnetic interference, wherein an outermost conductive layer is provided with a number of coordinated connection islands or the like, where selected connection islands are adapted for electrical and mechanical coaction with connection pads or the like for connection of a surface-mounted discrete component.

In accordance with the present invention, it is proposed that a circuit board of this kind is provided with a further electrically conductive layer which is located close to and beneath said outermost conductive layer and isolated therefrom by an insulating layer, and which is comprised of layer foil which screens against electromagnetic interference, wherein said electrically conductive layer foil has provided therein a number of through-penetrating holes, each of which has an adapted and dimensioned cross-sectional size which slightly exceeds the cross-sectional size of an electric conductor drawn through said hole, and wherein one end of said conductor is connected, either directly or indirectly, to one of said connection conductors, connection pads or the like, and at its other end is connected directly to a conductor in a conductor pattern formed in an inner, additional electrically conductive layer.

According to preferred embodiments that lie within the scope of the inventive concept, the through-penetrating holes have a diameter smaller than 1.0 mm.

The conductor drawn through a hole may be comprised of a connection sleeve whose one end coacts with a connection island.

According to one particular embodiment, two layer foils which screen against electromagnetic interference are each located on a respective side of a number of signal layers, wherein said two layer foils are connected electrically together, either directly or indirectly, and to earth potential.

According to one embodiment, the screening layer foils are mutually connected through the medium of through-plated, edge-orientated holes, where the distance between adjacent holes is smaller than 3 mm, preferably about 1 mm.

The screening layer foils are conveniently connected together by copper plating.

Advantages

Those advantages primarily afforded by an inventive circuit board arrangement reside in the creation of conditions whereby effective screening of EMI radiation can be achieved in a circuit board comprised of a plurality of electrically conductive layers and conductor patterns formed therein, and intermediate electrically insulating layers, with the aid of a further electrically conductive layer foil which functions as an electromagnetic interference screen, and therewith provide conditions for obtaining an effectively screening layer foil having small holes adapted for through-passing conductors.

The holes formed in the layer foil may have a size which results in a hole-related resonance frequency that is many times greater, at least one-hundred times greater, than the highest circuit-board related frequency.

The main characteristic features of an inventive circuit board arrangement are set forth in the characterizing clause of the following claim 1.

BRIEF DESCRIPTION OF THE DRAWINGS

An embodiment of an inventive circuit board arrangement at present preferred will now be described in more detail with reference to the accompanying drawings, in which

FIG. 4 is a perspective, partially sectioned view of a circuit board with surface-mounted discrete components, wherein part of the layer foils have been removed for the sake of clarification.

DESCRIPTION OF EMBODIMENTS AT PRESENT PREFERRED

Figure 1:
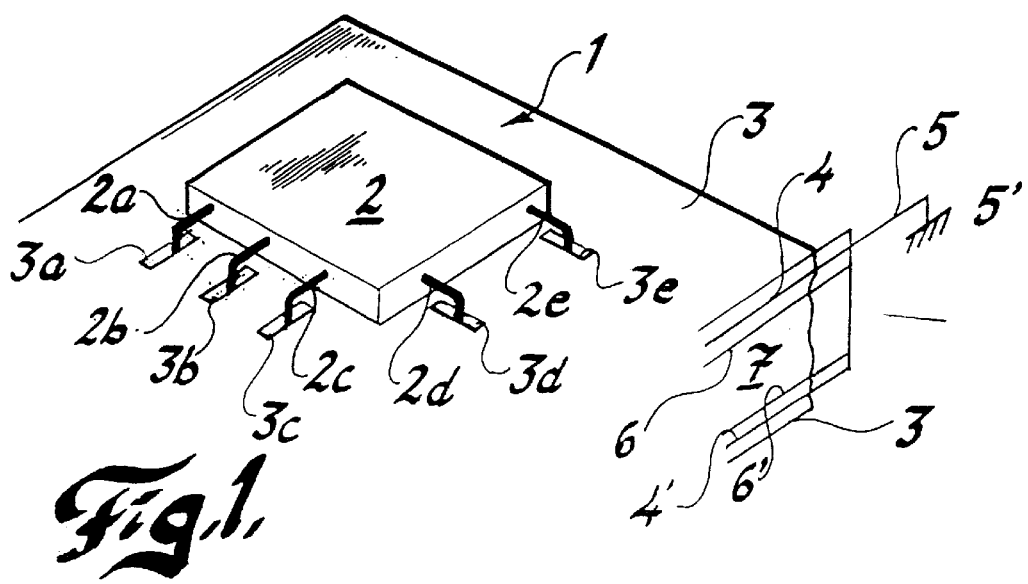
FIG. 1 is a perspective view of part of a circuit board with a discrete component mounted thereon.
Figure 2:
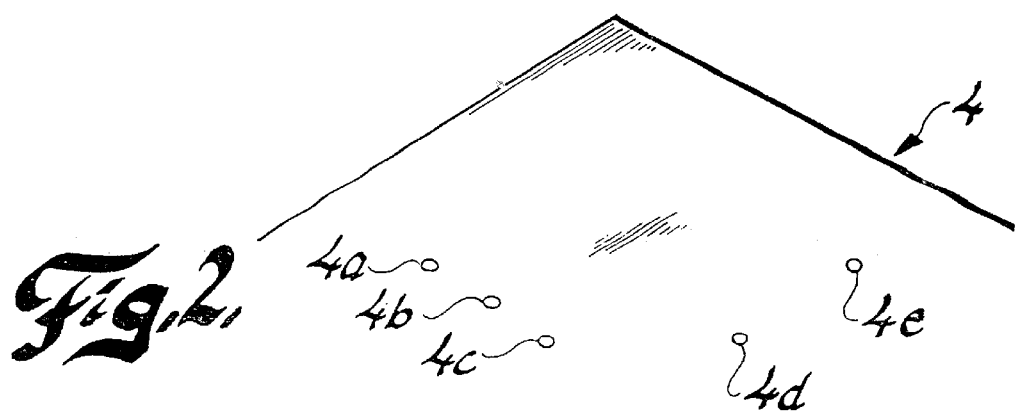
FIG. 2 illustrates an underlying layer foil formed in accordance with the invention and screening, essentially completely, against electromagnetic interference.
Figure 3:
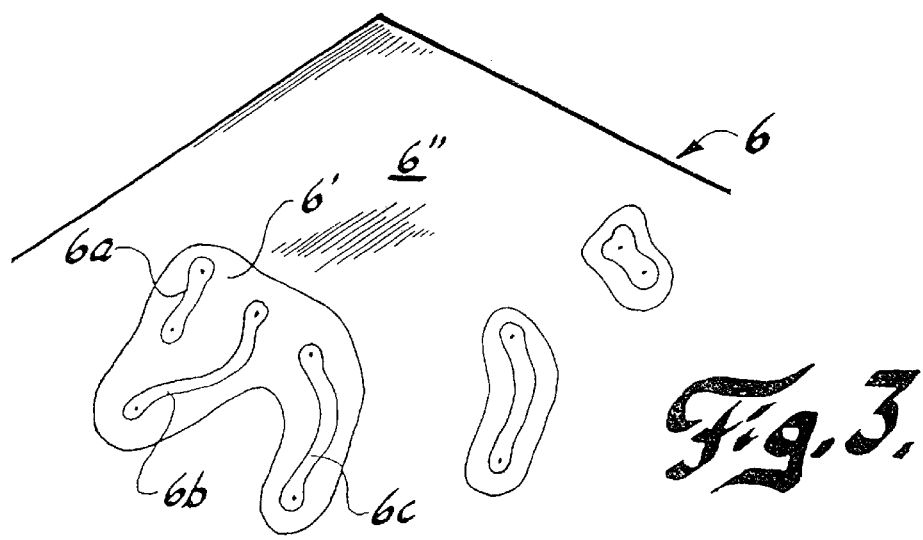
FIG. 3 is a view of a layer foil only partly screening against electromagnetic interference.

FIG. 1 shows in perspective part of a circuit board 1 and a discrete component 2 mounted on the surface thereof.

Discrete components 2 of the kind intended here normally include a plurality of connection conductors or connection pins, although for the sake of simplicity only five connection conductors of a semi-conductor component 2 are shown in FIG. 1. These connection conductors are designated $2a \ldots 2d$ and each is connected to a respective connection pad or connection island $3a \ldots 3e$, formed in an uppermost and outermost pad layer 3.

The pad layer 3 is comprised of an electrically conductive foil and is earth-potential related with regard to those sections that do not form connection pads.

Located beneath the pad layer 3 is an electrically insulating foil and a first screening electrically conductive layer foil 4 in accordance with the invention, said layer foil 4 being connectable to earth potential 5' by means of a conductor 5.

The illustrated circuit board also includes an electrically insulated foil and an earth-potential related second foil layer 6, which is followed by a plurality of electrically conductive layers having conductor patterns formed therein, and intermediate electrically insulating layers coordinated in a region which has been shown generally at 7, since these layers are not required in obtaining an understanding of the present invention.

The circuit board 1 may conveniently be provided with an additional pad layer 3', an additional electromagnetic interference screening foil layer 4', and an additional layer 6' which screens partially against electromagnetic interference on the opposite side of the circuit board.

The circuit board 1 thus includes a surface-related layer 6 which screens against electromagnetic interference, wherein an outermost conductive layer 3 is provided with a number of coordinated connection islands $3a \ldots 3e$, where selected connection islands are adapted for electrical and mechanical coaction with connection conductors $2a \ldots 2e$ for a discrete surface-mounted component 2, a so-called semiconductor component.

The invention is based on the use of a further electrically conductive layer 4 which is contiguous with the aforesaid outermost conductive layer 3 and which is comprised of an outermost layer foil which totally screens against electromagnetic interference.

The electrically conductive layer foil includes a number of through-penetrating holes $4a \ldots 4e$, each of which has a cross-sectional size which is slightly greater than the cross-sectional size of an electric conductor, a pin or the like, drawn through the hole.

One end of each such electric conductor is connected, either directly or indirectly, with one of said connection conductors $2a \ldots 2e$, while the other end is connected directly to a conductor (6a) in a conductor pattern formed in still another electrically conductive layer (6) coacting with the conductor pattern within the region 7.

The diameter of the through-penetrating holes $4a \ldots 4e$ is smaller than 1.0 mm and the holes are positioned in the layer foil 4 in coordination with the connection pads $3a \ldots 3e$.

According to one embodiment, the conductor drawn through a hole may comprise a connection sleeve (40) whose one end coacts with one of said connection pads 3d.

It is particularly proposed in accordance with the invention that two layer foils 4, 4' that screen against electromagnetic interference are each disposed on a respective side of a number of intermediate signal layer foils within the region 7.

The two layer foils 4, 4' are mutually connected electrically.

Said two pairs of layer foils 4, 4' and 6, 6' are also connected to earth potential.

Each connecting sleeve is comprised of a plated copper sleeve.

The aforesaid screening layer foils 4, 4' and 6, 6' respectively are mutually connected via through-plated edge-orientated holes $8a \ldots 8e$, said holes having a spacing which is preferably smaller than 3 mm, and preferably about 1 mm.

The aforesaid screening layer foils 4, 4' and 6, 6' may also be mutually connected by copper plating 9.

The electrically conductive foil 6 is provided with conductor sections $6a$, $6b$ and $6c$, by etching away a surface section 6'.

It will be understood that the conductor sections 6a, 6b and 6c may be in electrical coaction with the conductors 2a, 2b and 2c.

The section 6" that is not etched away functions as an electromagnetic screen through the shown earth potential connection.

The invention provides at least two closely-related electromagnetic screening layers on each side of the circuit board.

It will noted in particular that solely partially screening layers, a pad layer 3, a totally screening layer 4 and a partially screening layer 6 may be coordinated to achieve the desired screen function.

It will be understood that the invention is not restricted to the aforedescribed and illustrated exemplifying embodiment thereof, and that modifications can be made within the inventive scope defined in the following Claims.

It will also be understood that the inventive concept can be applied to any type of discrete component connection, i.e. even connections that have not been described or mentioned with respect to the illustrated embodiment.

We claim:

1. A circuit board which comprises:

a plurality of electrically conductive layers, conductive patterns formed in said layers, and intermediate electrically insulating layers, a surface-related layer which screens against electromagnetic inference, wherein an outermost conductive layer is provided with a plurality of coordinated connection islands, where selected connection islands are adapted for electrical and mechanical coaction with connection pads for a discrete surface-mounted component, wherein a further electrically conductive layer located contiguous with and beneath said outermost conductive layer and separated therefrom by an insulating layer is comprised of a layer foil which screens against electromagnetic interference; in that said electrically conductive layer foil has formed therein a plurality of through-penetrating holes, each of which is adapted and dimensioned with a cross-sectional size which slightly exceeds the cross-sectional size of an electric conductor drawn through a respective hole, said electric conductor being connected at one end, either directly or indirectly, with one of said connection pads and connected at its other end directly to a conductor in a conductor pattern formed in an inner, further electrically conductive layer wherein said layer foil includes two layer foils which screen against electromagnetic interference located on a respective side of a plurality of intermediate layers.

2. A circuit board according to claim 1, wherein the through-penetrating holes are selected to have a diameter smaller than 1.0 mm.

3. A circuit board according to claim 1, wherein the conductor drawn through said hole is a connection sleeve whose one end coacts with one of said connection islands.

4. A circuit board according to claim 1, wherein said two layer foils are electrically connected one to the other.

5. A circuit board according to claim 4, wherein said two layer foils are connected to earth potential.

6. A circuit board according to claim 3, wherein the connecting sleeve is a copper-plated sleeve.

7. A circuit board according to claim 1, wherein said screening layer foils are mutually connected through the medium of through-plated and edge-orientated holes.

8. A circuit board according to claim 7, wherein the spacing of the holes is selected to be less than 3 mm, preferably about 1 mm.

9. A circuit board according to claim 1, wherein said screening layer foils are mutually connected by copper-plating.

10. A circuit board according to claim 2, wherein the conductor drawn through said hole is a connection sleeve whose one end coacts with one of said connection islands.

11. A circuit board according to claim 1, wherein said two layer foils are electrically connected one to the other.

12. A circuit board according to claim 1, wherein said screening layer foils are mutually connected through the medium of through-plated and edge-orientated holes.

13. A circuit board according to claim 1, wherein said screening layer foils are mutually connected by copper-plating.

* * * * *